United States Patent
Hokenmaier et al.

(10) Patent No.: US 7,292,488 B2
(45) Date of Patent: Nov. 6, 2007

(54) TEMPERATURE DEPENDENT SELF-REFRESH MODULE FOR A MEMORY DEVICE

(75) Inventors: Wolfgang Hokenmaier, Burlington, VT (US); Peter Thwaite, Burlington, VT (US)

(73) Assignee: Infineon Technologies AG, Munich (DE)

( * ) Notice: Subject to any disclaimer, the term of this patent is extended or adjusted under 35 U.S.C. 154(b) by 100 days.

(21) Appl. No.: 11/175,724

(22) Filed: Jul. 6, 2005

(65) Prior Publication Data

US 2007/0008798 A1 Jan. 11, 2007

(51) Int. Cl.
G11C 7/00 (2006.01)
H03L 7/00 (2006.01)

(52) U.S. Cl. .................. 365/212; 365/211; 365/222; 331/176

(58) Field of Classification Search ................ 331/66, 331/70, 176; 327/512; 365/211, 212, 222
See application file for complete search history.

(56) References Cited

U.S. PATENT DOCUMENTS

| 6,288,959 | B1 | 9/2001 | OuYang et al. | |
|---|---|---|---|---|
| 6,504,407 | B2* | 1/2003 | Park et al. | 327/115 |
| 6,515,929 | B1 | 2/2003 | Ting et al. | |
| 6,542,959 | B2 | 4/2003 | Tabo | |
| 6,557,072 | B2 | 4/2003 | Osborn | |
| 6,643,205 | B2 | 11/2003 | Kim | |
| 6,721,223 | B2* | 4/2004 | Matsumoto et al. | 365/222 |
| 6,735,137 | B2 | 5/2004 | Jung et al. | |
| 6,795,363 | B2 | 9/2004 | Nakashima et al. | |
| 6,801,468 | B1 | 10/2004 | Lee | |
| 6,831,873 | B1 | 12/2004 | Glassie | |
| 6,836,824 | B1 | 12/2004 | Mirov et al. | |
| 6,970,393 | B1* | 11/2005 | Cho et al. | 365/222 |
| 7,035,157 | B2* | 4/2006 | Chang | 365/222 |
| 2005/0134393 | A1* | 6/2005 | Kim et al. | 331/36 C |
| 2006/0245288 | A1* | 11/2006 | Hokenmaier | 365/222 |

FOREIGN PATENT DOCUMENTS

JP 2002373489 12/2002
KR 20000043181 12/1998

OTHER PUBLICATIONS

Stonick et al, "An adaptive PAM-4 5-Gb/s Backplane Transeiver in 0.25-μm CMOS", IEEE Journal of Solid State Circuits, vol. 38, issue 3, pp. 436-443.*
Examination Report dated Jun. 29, 2007.

* cited by examiner

Primary Examiner—Amir Zarabian
Assistant Examiner—Michael Weinberg
(74) Attorney, Agent, or Firm—Dicke, Billig & Czaja, PLLC

(57) ABSTRACT

A self-refresh module includes an oscillator configured to provide a first signal having a first frequency, a trimming divider configured to trim the first signal to provide a second signal having a second frequency, and a temperature sensor configured to sense a temperature of the memory device and provide a temperature signal. The self-refresh module includes a temperature look-up table configured to receive the temperature signal and provide a third signal based on the temperature signal, and a temperature divider configured to provide a self-refresh pulse signal based on the second signal and the third signal.

27 Claims, 8 Drawing Sheets

| TEMPERATURE RANGE | TEMPS ||||||||
|---|---|---|---|---|---|---|---|---|
| | TEMP125 | TEMP105 | TEMP90 | TEMP70 | TEMP55 | TEMP40 | TEMP15 | TEMP-5 |
| TEMP > 105 | HIGH | LOW | LOW | LOW | LOW | LOW | LOW | LOW |
| 105 ≥ TEMP > 90 | LOW | HIGH | LOW | LOW | LOW | LOW | LOW | LOW |
| 90 ≥ TEMP > 70 | LOW | LOW | HIGH | LOW | LOW | LOW | LOW | LOW |
| 70 ≥ TEMP > 55 | LOW | LOW | LOW | HIGH | LOW | LOW | LOW | LOW |
| 55 ≥ TEMP > 40 | LOW | LOW | LOW | LOW | HIGH | LOW | LOW | LOW |
| 40 ≥ TEMP > 15 | LOW | LOW | LOW | LOW | LOW | HIGH | LOW | LOW |
| 15 ≥ TEMP > -5 | LOW | LOW | LOW | LOW | LOW | LOW | HIGH | LOW |
| -5 ≥ TEMP | LOW | LOW | LOW | LOW | LOW | LOW | LOW | HIGH |

Fig. 5

TEMPERATURE DEPENDENT SELF-REFRESH MODULE FOR A MEMORY DEVICE

BACKGROUND

Memory speed and memory capacity continue to increase to meet the demands of system applications. Some of these system applications include mobile electronic systems that have limited space and limited power resources. In mobile applications, such as cellular telephones and personal digital assistants (PDAs), memory cell density and power consumption are issues for future generations.

To address these issues, the industry is developing random access memories (RAMs) for mobile applications. One type of RAM, referred to as CellularRAM, is a high performance and low power memory designed to meet the growing memory density and bandwidth demands of future designs. CellularRAM is a pseudo static RAM (PSRAM) that offers a lower cost per bit ratio than typical solutions. Also, CellularRAM offers static random access memory (SRAM) pin and function compatibility, external refresh-free operation, and a low power design. CellularRAM devices are drop-in replacements for most asynchronous low power SRAMs currently used in mobile applications, such as cellular telephones.

Each memory cell in a DRAM includes a transistor and a capacitor. The capacitor is charged and discharged to represent a logic "0" or a logic "1". During a read operation, a data bit value stored on the capacitor is read. During a write operation, a data bit value is written to the capacitor. A read operation on a memory cell is destructive. After each read operation, the capacitor is recharged or discharged to the data value that was just read. In addition, even without read operations, the charge on the capacitor discharges over time.

To retain a stored data bit value, the memory cell is refreshed periodically by reading and/or writing to the memory cell. All memory cells within a DRAM are periodically refreshed to maintain their values. During self-refresh, the rate at which the memory cells are refreshed is typically defined by a self-refresh module including a self-refresh oscillator and trimming circuits. The self-refresh oscillator and trimming circuits typically provide a self-refresh pulse for initiating a self-refresh of the memory cells. The base frequency of the self-refresh oscillator contributes to standby power consumption. Therefore, by reducing the oscillator base frequency of the self-refresh oscillator, the standby power consumption can be reduced.

SUMMARY

One embodiment of the present invention provides a self-refresh module for a memory device. The self-refresh module includes an oscillator configured to provide a first signal having a first frequency, a trimming divider configured to trim the first signal to provide a second signal having a second frequency, and a temperature sensor configured to sense a temperature of the memory device and provide a temperature signal. The self-refresh module includes a temperature look-up table configured to receive the temperature signal and provide a third signal based on the temperature signal, and a temperature divider configured to provide a self-refresh pulse signal based on the second signal and the third signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 5 is a table illustrating one embodiment of the logic levels of temperature output signals from a temperature sensor based on a sensed temperature.

DETAILED DESCRIPTION

Figure 1:
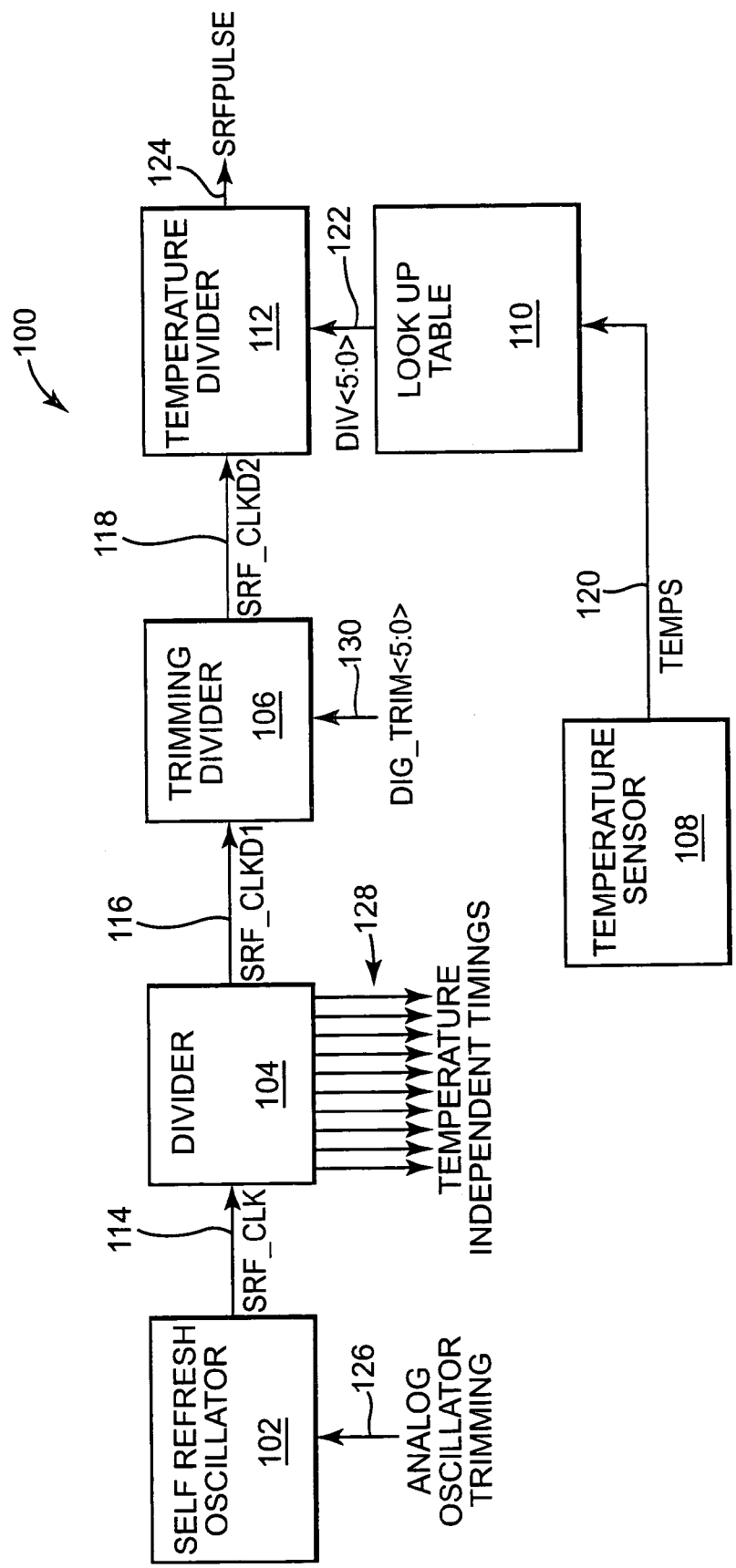
FIG. 1 is a block diagram illustrating one embodiment of a self-refresh module for a memory device.

FIG. 1 is a block diagram illustrating one embodiment of a self-refresh module 100. Self-refresh module 100 is one of several modules included within a memory device, such as a DRAM or a pseudo SRAM. Self-refresh module 100 includes self-refresh oscillator 102, divider 104, trimmer divider 106, temperature sensor 108, look-up table 110, and temperature divider 112.

Self-refresh oscillator 102 receives an analog oscillator trimming signal on analog oscillator trimming signal path 126. Self-refresh oscillator 102 is electrically coupled to divider 104 through self-refresh clock (SRF_CLK) signal path 114. Divider 104 provides temperature independent timing signals on temperature independent timing signal paths 128. Divider 104 is electrically coupled to trimming divider 106 through first self-refresh clock divided (SRF_CLKD1) signal path 116. Trimming divider 106 receives digital trimming (DIG_TRIM<5:0>) signals on DIG_TRIM<5:0> signal paths 130. Trimming divider 106 is electrically coupled to temperature divider 112 through second self-refresh clock divided (SRF_CLKD2) signal path 118. Temperature divider 112 provides a self-refresh pulse (SRF-PULSE) signal on SRFPULSE signal path 124. Temperature divider 112 is electrically coupled to lookup table 110 through divider (DIV<5:0>) signal paths 122. Lookup table 110 is electrically coupled to temperature sensor 108 through temperatures (TEMPS) signal paths 120.

Memory cells of DRAM devices and pseudo SRAM devices are periodically refreshed so that data or information stored in the memory cells is not lost or corrupted. Self-refresh module 100 is a device capable of providing a refresh function for a memory device influenced by temperature variations. Refresh frequencies for memory devices, such as DRAMs and pseudo SRAMs, are influenced by temperatures external or internal (self heating due to power consumption) to the memory devices. At lower temperatures, a DRAM or pseudo SRAM can be refreshed at a lower frequency, which minimizes current and power consumption, since capacitors in DRAM devices or pseudo SRAM devices lose charge at a rate proportional to the device temperature. Conversely, at higher temperatures, higher refresh frequencies are used to prevent information loss, thereby increasing power consumption. Self-refresh module 100 generates and provides the SRFPULSE signal, which is modified based on the temperature sensed by temperature sensor 108.

Self-refresh oscillator 102 provides the SRF_CLK signal on SRF_CLK signal path 114 based on the analog oscillator trimming signal on signal path 126. Self-refresh oscillator 102 receives the analog oscillator trimming signal, which switches capacitors within self-refresh oscillator 102 on and off to adjust the oscillator frequency based on the requirements of self-refresh module 100. Increasing the capacitance provides a SRF_CLK signal having a lower frequency. Conversely, reducing the capacitance provides a SRF_CLK signal having a higher frequency.

Figure 2:
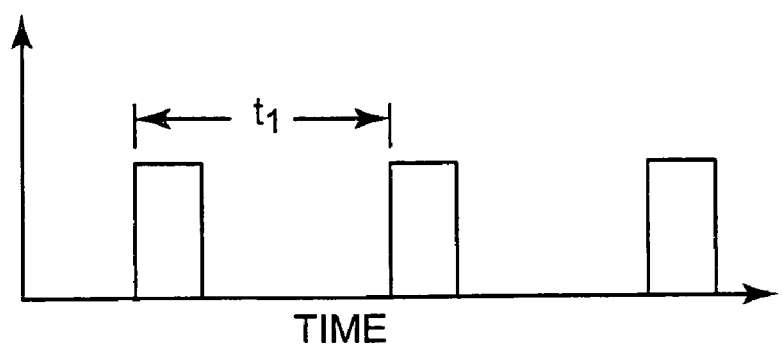
FIG. 2 is a graph illustrating one embodiment of a self-refresh clock signal versus time provided by a self-refresh oscillator.

FIG. 2 is a graph illustrating one embodiment of the SRF_CLK signal including a series of pulses having a period of $t_1$. Period $t_1$ is defined and controlled by the analog oscillator trimming signal and self-refresh oscillator 102. A relatively large capacitance within self-refresh oscillator 102 generates a SRF_CLK signal having a correspondingly low frequency. Conversely, a relatively small capacitance within self-refresh oscillator 102 generates a SRF_CLK signal having a correspondingly high frequency. In one embodiment, period $t_0$ is within a range of approximately 250-750 nanoseconds, such as 500 nanoseconds.

The SRF_CLK signal is provided to divider 104 through SRF_CLK signal path 114. Divider 104 divides the incoming SRF_CLK signal to provide the SRF_CLKD1 signal. In one embodiment, divider 104 is excluded from self-refresh module 100. In one embodiment, divider 104 provides temperature independent timing signals on signal paths 128 based on the SRF_CLK signal. Depending upon the circuit configuration, the temperature independent timing signals can be used by other modules of the memory device or by other components within self-refresh module 100. For example, the temperature independent timing signals can be electrically coupled to temperature sensor 108, so that temperature sensor 108 is turned on periodically to check the temperature of the memory device, since temperature variations do not occur instantaneously. In one embodiment, divider 104 adjusts the output signal SRF_CLKD1 and therefore ultimately the refresh rate based on the information whether or not there is additional noise on the DRAM (e.g. active cycles in addition to the normal refresh cycles, known as "active retention"), which generally requires an increased refresh frequency. If such additional noise is not present ("passive retention") the frequency of SRF_CLKD1 can be lowered, which provides additional savings in power consumption.

Figure 3:
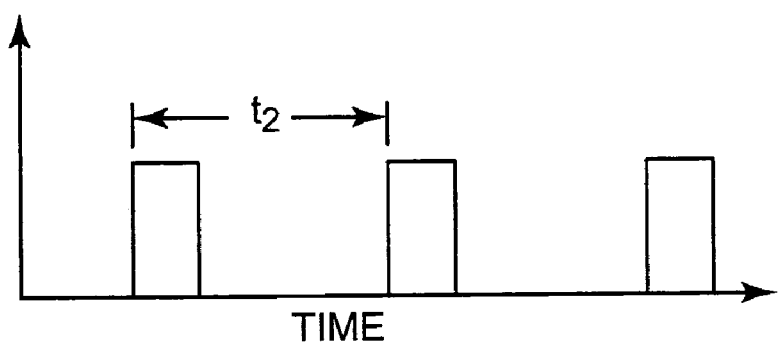
FIG. 3 is a graph illustrating one embodiment of a first divided self-refresh clock signal provided by a divider circuit.

FIG. 3 is a graph illustrating one embodiment of the SRF_CLKD1 signal including a series of pulses having a period $T_2$. Period $T_2$ is defined and controlled by divider 104 based on the SRF_CLK signal. In one embodiment, divider 104 divides the SRF_CLK signal to provide the SRF_CLKD1 signal having a period $T_2$ within a range of approximately 500 nanoseconds to 8 microseconds.

Trimming divider 106 is a digital divider for trimming the incoming SRF_CLKD1 signal based the DIG_TRIM<5:0> signals to provide the SRF_CLKD2 signal. In one embodiment, the DIG_TRIM<5:0> signals comprise six bits. Based on the DIG_TRIM<5:0> signals, trimming divider 106 trims the SRF_CLKD1 signal by one of up to 64 values. For example, 000000 represents digital value 0,111111 represents digital value 63, and 100000 represents digital value 32. Value 63 generates the lowest frequency for the SRF_CLKD2 signal. Conversely, value 0 generates the fastest frequency for the SRF_CLKD2 signal.

In one embodiment, trimmer divider 106 is initially set at or near the center value, such as 011111, which represents value 31. Therefore, the trimming of the SRF_CLKD1 signal can be adjusted in fine steps, such as from 011111 (value 31) to 100000 (value 32). Thereby, the trimming of the SRF_CLKD1 signal to provide the SRF_CLKD2 signal can be completed in roughly one-thirty-second (1/32) increments, or approximately a three percent (3%) trimming granularity based on the initial value. Conversely, if trimming divider 106 is initially set to 000010, representing value 2, and trimming occurs from 000010 to 000011, representing value 3, a fifty percent (50%) trimming granularity is achieved. Thus, trimming is coarser at the lower end of the range. The SRF_CLKD2 signal is temperature independent and set via the DIG_TRIM<5:0> signals for a specific memory cell retention time.

Figure 4:
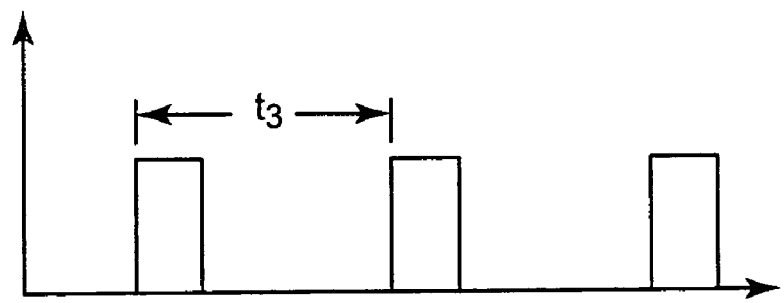
FIG. 4 is a graph illustrating one embodiment of a second divided self-refresh clock signal provided by a trimming divider.

FIG. 4 is a graph illustrating one embodiment of the SRF_CLKD2 signal including a series of pulses having a period $T_3$. Period $T_3$ is defined and controlled by the DIG_TRIM<5:0> signals and trimming divider 106. In one embodiment, period $T_3$ is within a range of approximately 500 nanosecond to 128 microseconds.

Temperature divider 112 trims the SRF_CLK2 signal to provide the SRFPULSE signal based on the temperature of the memory device as sensed by temperature sensor 108. In one embodiment, temperature divider 112 is designed to trim the SRF_CLKD2 signal by one of up to sixty-four distinct values, via the six bits of the DIV<5:0> signals.

Temperature sensor 108 is configured to sense the temperature of the memory device incorporating self-refresh module 100. Temperature sensor 108 provides temperature sensed signals (TEMPS) on TEMPS signal paths 120, which are representative of the temperature sensed by temperature sensor 108. In one embodiment, temperature sensor 108 can sense a temperature within the range of −30° C. to 130° C.

FIG. 5 is a table 109 illustrating one embodiment of the logic levels of the TEMPS signals output by temperature sensor 108. Table 109 includes temperature ranges of less than −5° C., greater than 105° C., and between −5° C. and 15° C., 15° C. and 40° C., 40° C. and 55° C., 55° C. and 70° C., 70° C. and 90° C., and 90° C. and 105° C. Table 109 also includes the logic levels of the TEMPS signals within each temperature range. The TEMPS signals include the TEMP125, TEMP105, TEMP90, TEMP70, TEMP55, TEMP40, TEMP15, and TEMP−5 signals. Within each temperature range, one of the TEMPS signals is logic high and the remaining TEMPS signals are logic low. For example, if the temperature is between 90° C. and 105° C., the TEMP105 signal is logic high and the TEMP125, TEMP90, TEMP70, TEMP55, TEMP40, TEMP15, and TEMP−5 signals are logic low.

Figure 6:
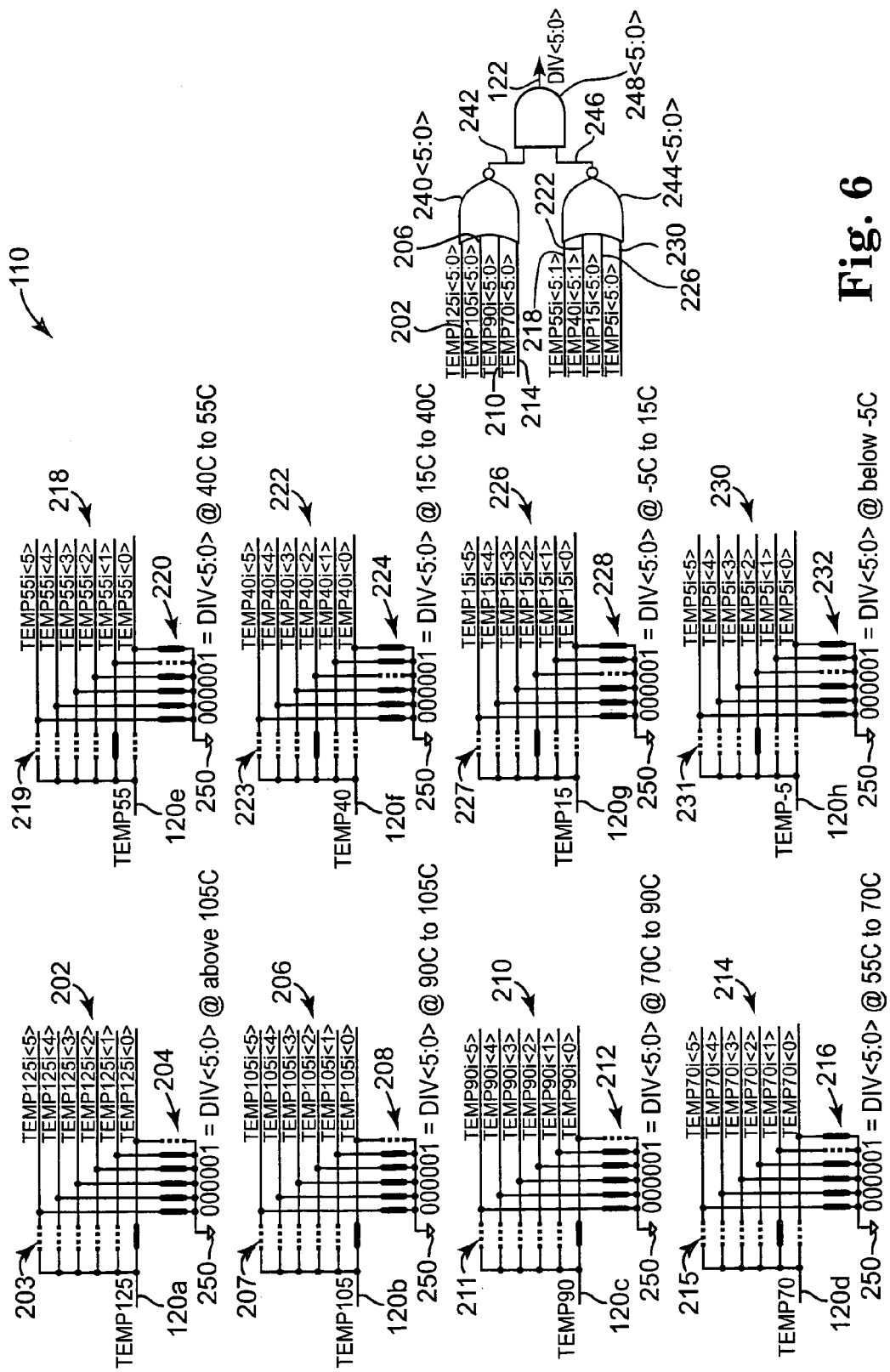
FIG. 6 is a diagram illustrating one embodiment of a lookup table.

FIG. 6 is a diagram illustrating one embodiment of lookup table 110. Look-up table 110 is configured to receive the TEMPS signals from temperature sensor 108 and provide the DIV<5:0> signals to temperature divider 112. Lookup table 110 comprises eight portions for setting the DIV<5:0> signals based on the TEMPS signals. TEMP125 signal path 120a is electrically coupled to the TEMP125i<0> signal path 202 through the metal options as indicated at 203. The other TEMP125*i*<1> to TEMP125*i*<5> signal paths 202 are electrically coupled to ground 250 through the metal options as indicated at 204. Therefore, in this embodiment, the DIV<5:0> signals are set equal to 000001 as indicated if the temperature is greater than 105° C.

TEMP 105 signal path 120*b* is electrically coupled to the TEMP 105*i*<0> signal path 206 through the metal options as indicated at 207. The other TEMP105*i*<1> to TEMP105*i*<5> signal paths 206 are electrically coupled to ground 250 through the metal options as indicated at 208. Therefore, in this embodiment, the DIV<5:0> signals are set equal to 000001 as indicated if the temperature is between 90° C. and 105° C.

TEMP90 signal path 120*c* is electrically coupled to the TEMP90*i*<0> signal path 210 through the metal options as indicated at 211. The other TEMP90*i*<1> to TEMP90*i*<5> signal paths 210 are electrically coupled to ground 250 through the metal options as indicated at 212. Therefore, in this embodiment, the DIV<5:0> signals are set equal to 000001 as indicated if the temperature is between 70° C. and 90° C.

TEMP70 signal path 120*d* is electrically coupled to the TEMP70*i*<1> signal path 214 through the metal options as indicated at 215. The other TEMP70*i*<0> and TEMP70*i*<2> to TEMP70*i*<5> signal paths 214 are electrically coupled to ground 250 through the metal options as indicated at 216. Therefore, in this embodiment, the DIV<5:0> signals are set equal to 000010 as indicated if the temperature is between 55° C. and 70° C.

TEMP55 signal path 120*e* is electrically coupled to the TEMP50*i*<1> signal path 218 through the metal options as indicated at 219. The other TEMP55*i*<0> and TEMP55*i*<2> to TEMP55*i*<5> signal paths 218 are electrically coupled to ground 250 through the metal options as indicated at 220. Therefore, in this embodiment, the DIV<5:0> signals are set equal to 000010 as indicated if the temperature is between 40° C. and 55° C.

TEMP40 signal path 120*f* is electrically coupled to the TEMP40*i*<2> signal path 222 through the metal options as indicated at 223. The other TEMP40*i*<0>, TEMP40*i*<1>, and TEMP40*i*<3> to TEMP40*i*<5> signal paths 222 are electrically coupled to ground 250 through the metal options as indicated at 224. Therefore, in this embodiment, the DIV<5:0> signals are set equal to 000100 as indicated if the temperature is between 15° C. and 40° C.

TEMP 15 signal path 120*g* is electrically coupled to the TEMP 15*i*<2> signal path 226 through the metal options as indicated at 227. The other TEMP15*i*<0>, TEMP15*i*<1>, and TEMP15*i*<3> to TEMP15*i*<5> signal paths 226 are electrically coupled to ground 250 through the metal options as indicated at 228. Therefore, in this embodiment, the DIV<5:0> signals are set equal to 000100 as indicated if the temperature is between −5° C. and 15° C.

TEMP−5 signal path 120*h* is electrically coupled to the TEMP−5*i*<2> signal path 230 through the metal options as indicated at 231. The other TEMP−5*i*<0>, TEMP−5*i*<1>, and TEMP−5*i*<3> to TEMP−5*i*<5> signal paths 230 are electrically coupled to ground 250 through the metal options as indicated at 232. Therefore, in this embodiment, the DIV<5:0> signals are set equal to 000100 as indicated if the temperature is less than −5° C.

Lookup table 110 also includes NOR gates 240 and 244 and NAND gate 248. TEMP125*i*<5:0> signal paths 202 are electrically coupled to the first inputs of NOR gates 240<5:0>. TEMP105*i*<5:0> signal paths 206 are electrically coupled to the second inputs of NOR gates 240<5:0>. TEMP90*i*<5:0> signal paths 210 are electrically coupled to the third inputs of NOR gates 240<5:0>. TEMP70*i*<5:0> signal paths 214 are electrically coupled to the fourth inputs of NOR gates 240<5:0>. The output of NOR gates 240<5:0> are electrically coupled to the first inputs of NAND gates 248<5:0> through signal paths 242. TEMP55*i*<5:0> signal paths 218 are electrically coupled to the first inputs of NOR gates 244<5:0>. TEMP40*i*<5:0> signal paths 222 are electrically coupled to the second inputs of NOR gates 244<5:0>. TEMP15*i*<5:0> signal paths 226 are electrically coupled to the third inputs of NOR gates 244<5:0>. TEMP−5*i*<5:0> signal paths 230 are electrically coupled to the fourth inputs of NOR gates 244<5:0>. The output of NOR gates 244<5:0> are electrically coupled to the second inputs of NAND gates 248<5:0> through signal paths 246. The outputs of NAND gates 248<5:0> provide the DIV<5:0> signals on DIV<5:0> signal paths 122.

NOR gates 240<5:0> and 244<5:0> and NAND gates 248<5:0> pass the selected values from the lookup table for the sensed temperature range to the DIV<5:0> signal paths 122. Based on the metal options in lookup table 110 and the TEMPS signals, the DIV<5:0> signals are set. Lookup table 110 enables any 64 bit value to be selected for each temperature range based on the metal options.

Figure 7:
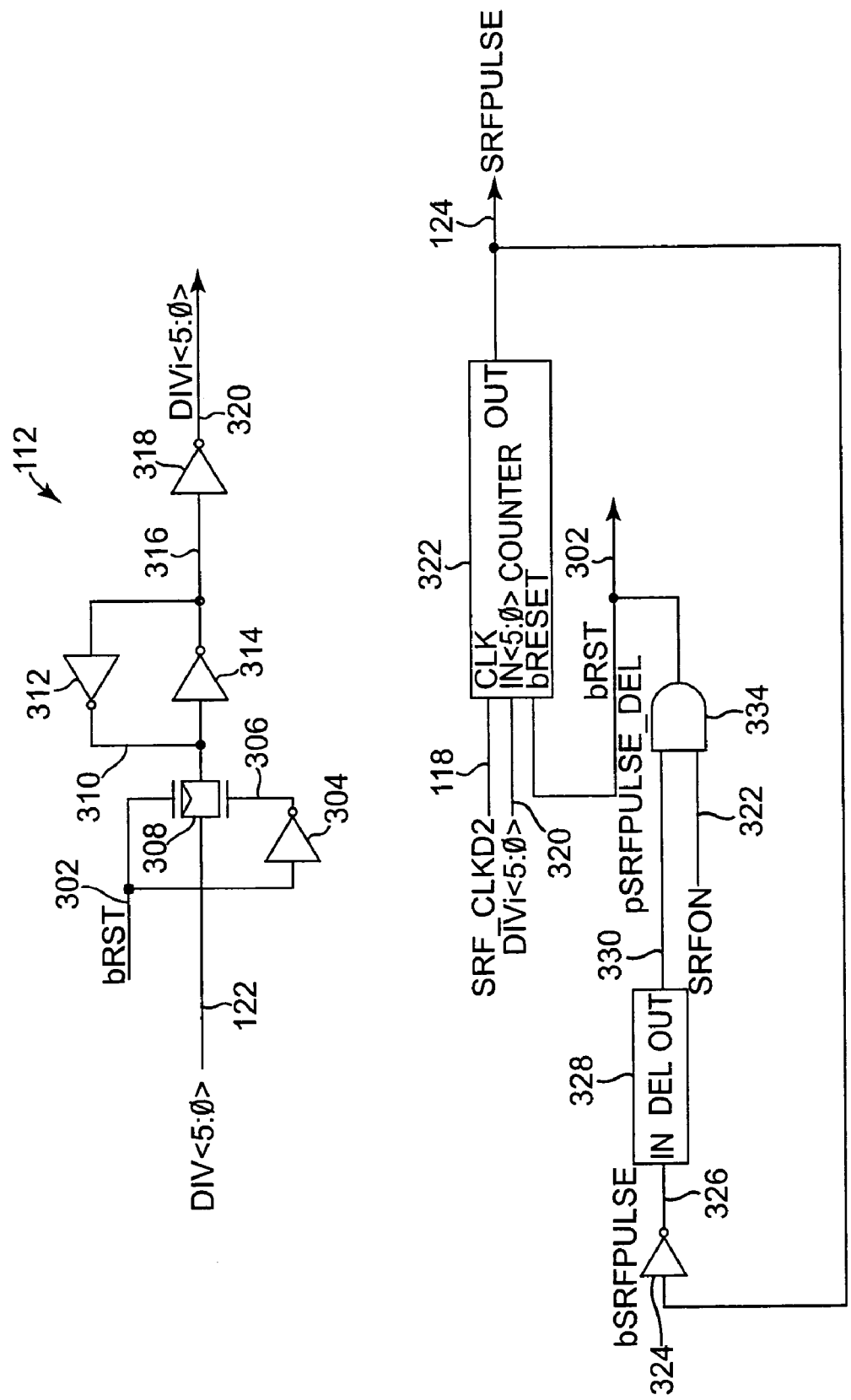
FIG. 7 is a diagram illustrating one embodiment of a temperature divider.

FIG. 7 is a diagram illustrating one embodiment of temperature divider 112. Temperature divider 112 includes transfer gate 308, inverters 304, 312, 314, 318, and 324, counter 322, delay (DEL) 328, and AND gate 334. The DIV<5:0> signal paths 122 are electrically coupled to the data input of transfer gate 308. The data output of transfer gate 308 is electrically coupled to the input of inverter 314 and the output of inverter 312 through signal paths 310. The input of inverter 304 and the logic low enable input of transfer gate 308 receive the inverted reset (bRST) signal on bRST signal path 302. The output of inverter 304 is electrically coupled to the logic high enable input of transfer gate 308 through signal path 306. The output of inverter 314 is electrically coupled to the input of inverter 312 and the input of inverter 318 through signal paths 316. The output of inverter 318 provides the DIVi<5:0> signals on DIVi<5:0> signal paths 320.

The clock (CLK) input of counter 322 receives the SFR_CLKD2 signal on SFR_CLKD2 signal path 118. The input (IN<5:0>) of counter 322 receives the DIVi<5:0> signals on DIVi<5:0> signal paths 320. The output of counter 322 provides the SRFPULSE signal and is electrically coupled to the input of inverter 324 through SRFPULSE signal path 124. The output of inverter 324 is electrically coupled to the input (IN) of delay 328 through inverted SRFPULSE (bSRFPULSE) signal path 326. The output of delay 328 is electrically coupled to a first input of AND gate 334 through delayed bSRFPULSE (bSRFPULSE_DEL) signal path 330. A second input of AND gate 334 receives the self-refresh on (SRFON) signal on SRFON signal path 332. The output of AND gate 334 is electrically coupled to the bRESET input of counter 322 through bRST signal path 302.

Inverter 304 inverts the bRST signal on bRST signal path 302 to provide the signal on signal path 306. In response to a logic low bRST signal, transfer gate 308 turns on to pass the DIV<5:0> signals on DIV<5:0> signal paths 122 to signal paths 310. In response to a logic high bRST signal, transfer gate 308 turns off to block the DIV<5:0> signals from passing to signal paths 310. Inverters 314 and 312 act as a latch to latch the signals on signal paths 310. Inverter 318 inverts the signals on signal paths 316 to provide the DIVi<5:0> signals on DIVi<5:0> signal paths 320.

Counter 322 is clocked by the SRF_CLKD2 signal and counts up to the DIVi<5:0> signals value. Once the counter has counted up to the DIVi<5:0> signals value, counter 322 provides a logic high SRFPULSE signal on SRFPULSE signal path 124. Inverter 324 inverts the SRFPULSE signal on SRFPULSE signal path 124 to provide the bSRFPULSE signal on bSRFPULSE signal path 326. Delay 328 receives the bSRFPULSE signal on bSRFPULSE signal path 326 and delays the signal to provide the bSRFPULSE_DEL signal on bSRFPULSE_DEL signal path 330.

AND gate 334 receives the bSRFPULSE_DEL signal on bSRFPULSE_DEL signal path 330 and the SRFON signal on SRFON signal path 332 to provide the bRST signal on bRST signal path 302. In response to a logic high bSRF-PULSE_DEL signal and a logic high SRFON signal, AND gate 334 provides a logic high bRST signal. In response to a logic low bSRFPULSE_DEL signal or a logic low SRFON signal, AND gate 334 provides a logic low bRST signal. In response to a logic low bRST signal, counter 322 resets the counter. In response to a logic high bRST signal, counter 322 begins and continues counting up to the DIVi<5:0> signals value.

In operation, transfer gate 308 is enabled to pass the DIV<5:0> signals to the latch formed by inverters 314 and 312 when counter 322 is reset. Therefore the DIVi<5:0> signals do not change while counter 322 is counting. A temperature change is recognized upon the reset of counter 322 such that the previous count of counter 322 is not affected. Counter 322 trims the SRF_CLKD2 signal to provide the SRFPULSE signal based on the DIVi<5:0> signals value. Delay 328 is selected to maintain the logic high SRFPULSE signal on SRFPULSE signal path 124 for a sufficient time to initiate a self-refresh of the memory cells of the memory device.

Figure 8:
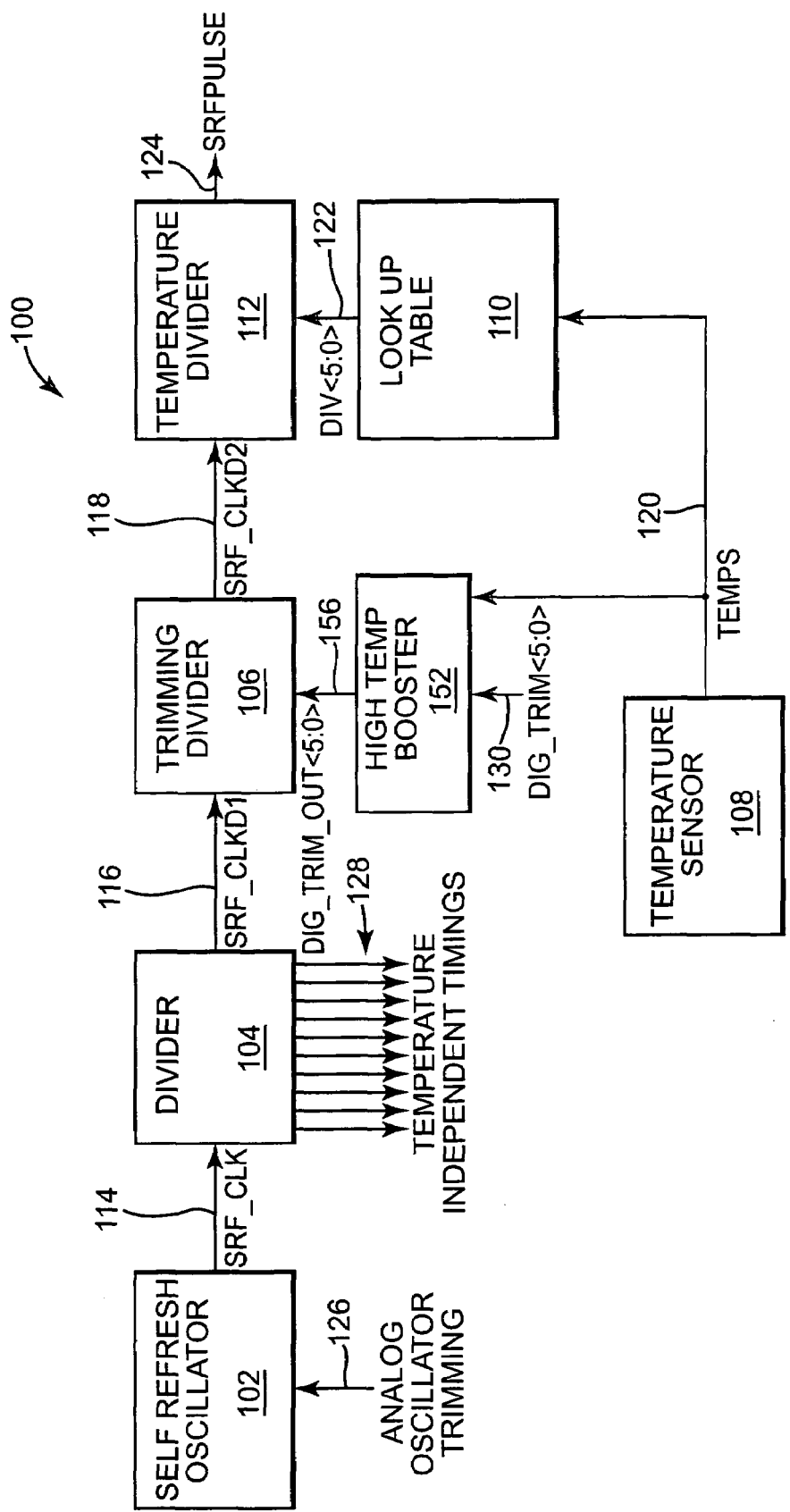
FIG. 8 is a block diagram illustrating another embodiment of a self-refresh module for a memory device.

FIG. 8 is a block diagram illustrating another embodiment of a self-refresh module 150. Self-refresh module 150 is similar to self-refresh module 100 in several aspects. Self-refresh module 150, however, further includes high temperature booster 152 and digital trim output (DIG_TRIM_OUT<5:0>) signals on DIG_TRIM_OUT<5:0> signal paths 156. In addition, the DIG_TRIM<5:0> signals are also provided to high temperature booster 152, rather than to trimming divider 106 of self-refresh module 100 as illustrated in FIG. 1.

High temperature booster 152 is used when high temperatures, such as temperatures greater than 90° C., are sensed by temperature sensor 108. At low to moderate temperatures, such as less than 90° C., the refresh frequency can be controlled by self-refresh module 100 of FIG. 1 to minimize power consumption at varying temperatures. At high temperatures, however, such as greater than 90° C., functionality is more important than power consumption. Therefore, at high temperatures, such as greater than 90° C., it is more important to ensure that the memory device operates properly.

High temperature booster 152 is configured to increase the frequency of the SRF_CLKD2 signal by a factor within a range of approximately 2-5 times if the sensed temperature is greater than 90° C. In one embodiment, high temperature booster 152 increases the frequency of the SRF_CLKD2 signal by a factor of approximately 4.

Figure 9:
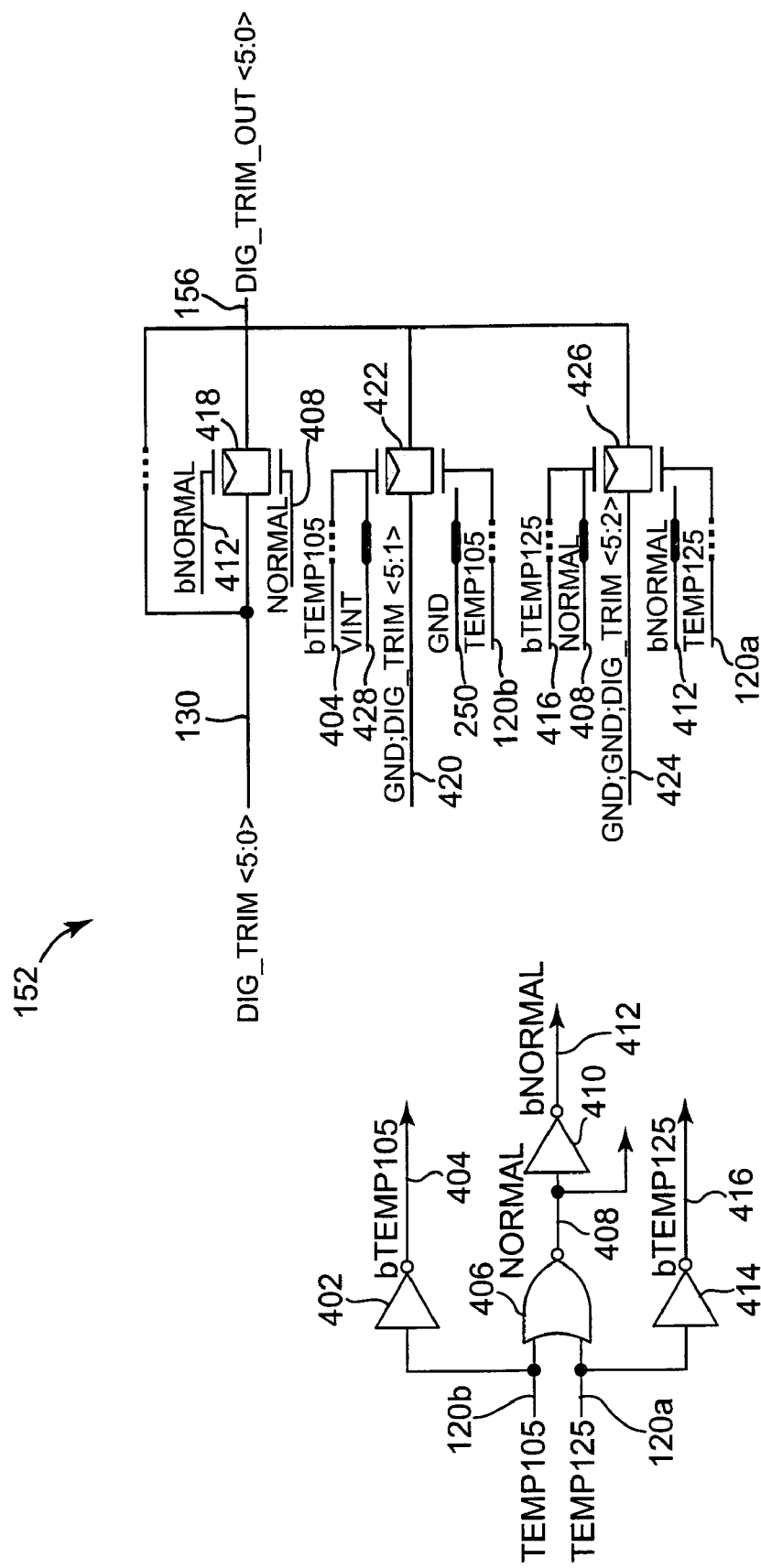
FIG. 9 is a diagram illustrating one embodiment of a high temperature booster.

FIG. 9 is a diagram illustrating one embodiment of high temperature booster 152. High temperature booster 152 includes inverters 402, 410, and 414, NOR gate 406, and transfer gates 418, 422, and 426. The input of inverter 402 and a first input of NOR gate 406 receive the TEMP105 signal on TEMP105 signal path 120b. The output of inverter 402 provides the inverted TEMP105 (bTEMP105) signal on bTEMP105 signal path 404. A second input of NOR gate 406 and the input of inverter 414 receive the TEMP125 signal on TEMP125 signal path 120a. The output of inverter 414 provides the inverted TEMP125 (bTEMP125) signal on bTEMP125 signal path 416. The output of NOR gate 406 is electrically coupled to the input of inverter 410 through NORMAL signal path 408. The output of inverter 410 provides the inverted NORMAL (bNORMAL) signal on bNORMAL signal path 412.

Transfer gate 418 receives the DIG_TRIM<5:0> signals on DIG_TRIM<5:0> signal paths 130 and provides the DIG_TRIM_OUT<5:0> signals on DIG_TRIM_OUT<5:0> signal paths 156. The logic low enable input of transfer gate 418 receives the bNORMAL signal on bNORMAL signal path 412, and the logic high enable input of transfer gate 418 receives the NORMAL signal on NORMAL signal path 408.

Transfer gate 422 receives a ground signal and the DIG_TRIM<5:1> signals on signal paths 420 and provides the DIG_TRIM_OUT<5:0> signals on DIG_TRIM_OUT<5:0> signal paths 156. For the selected metal options, the logic low enable input of transfer gate 422 is electrically coupled to Vint 428, and the logic high enable input of transfer gate 422 is electrically coupled to ground 250. For the other non-selected metal options for transfer gate 422, the logic low enable input of transfer gate 422 receives the bTEMP105 signal on bTEMP105 signal path 404, and the logic high enable input of transfer gate 422 receives the TEMP105 signal on TEMP105 signal path 120b.

Transfer gate 426 receives two ground signals and the DIG_TRIM<5:2> signals on signal paths 424 to provide the DIG_TRIM_OUT<5:0> signals on DIG_TRIM_OUT<5:0> signal paths 156. For the selected metal options, the logic low enable input of transfer gate 436 receives the NORMAL signal on NORMAL signal path 408, and the logic high enable input of transfer gate 426 receives the bNORMAL signal on bNORMAL signal path 412. For the other non-selected metal options for transfer gate 426, the logic low enable input of transfer gate 426 receives the bTEMP125 signal on bTEMP125 signal path 416, and the logic high enable input of transfer gate 426 receives the TEMP125 signal on TEMP125 signal path 120a.

Inverter 402 inverts the TEMP105 signal on TEMP105 signal path 120b to provide the bTEMP105 signal on bTEMP105 signal path 404. Inverter 414 inverts the TEMP125 signal on TEMP125 signal path 120a to provide the bTEMP125 signal on bTEMP125 signal path 416. In response to a logic low TEMP105 signal on TEMP 105 signal path 120b and a logic low TEMP125 signal on TEMP125 signal path 120a, NOR gate 406 outputs a logic high NORMAL signal on NORMAL signal path 408. In response to a logic high TEMP 105 signal or a logic high TEMP125 signal, NOR gate 406 outputs a logic low NORMAL signal. Inverter 410 inverts the NORMAL signal on NORMAL signal path 408 to provide the bNORMAL signal on bNORMAL signal path 412.

In response to a logic low bNORMAL signal and a logic high NORMAL signal, transfer gate 418 turns on to pass the DIG_TRIM<5:0> signals on signal paths 130 to the DIG_TRIM_OUT<5:0> signal paths 156. In response to a logic high bNORMAL signal and a logic low NORMAL signal, transfer gate 418 turns off to block the DIG_TRIM<5:0> signals on signal paths 130 from passing to the DIG_TRIM_OUT<5:0> signal paths 156.

For the selected metal options, in response to Vint 428 and ground 250, transfer gate 422 is turned off. For the other non-selected metal options, in response to a logic low bTEMP105 signal and a logic high TEMP105 signal, transfer gate 422 turns on to pass a ground signal and the DIG_TRIM<5:1> signals on signal paths 420 to the DIG_TRIM_OUT<5:0> signal paths 156. In response to a logic high bTEMP105 signal and a logic low TEMP105 signal, transfer gate 422 turns off to block the ground signal and the DIG_TRIM<5:1> signals on signal paths 420 from passing to the DIG_TRIM_OUT<5:0> signal paths 156. When turned on, transfer gate 422 shifts the DIG_TRIM<5:0> signals to the right by one bit (discarding the least significant bit) and replaces the most significant bit with a zero to provide the DIG_TRIM_OUT<5:0> signals.

For the selected metal options, in response to a logic low NORMAL signal and a logic high bNORMAL signal, transfer gate 426 turns on to pass the two ground signals and the DIG_TRIM<5:2> signals on signal paths 424 to the DIG_TRIM_OUT<5:0> signal paths 156. In response to a logic high NORMAL signal and a logic low bNORMAL signal, transfer gate 426 turns off to block the two ground signals and the DIG_TRIM<5:2> signals on signal paths 424 from passing to the DIG_TRIM_OUT<5:0> signal paths 156. For the other non-selected metal options, in response to a logic low bTEMP125 signal and a logic high TEMP125 signal, transfer gate 426 turns on to pass the two ground signals and the DIG_TRIM<5:2> signals on signal paths 424 to the DIG_TRIM_OUT<5:0> signal paths 156. In response to a logic high bTEMP125 signal and a logic low TEMP125 signal, transfer gate 426 turns off to block the two ground signals and the DIG_TRIM<5:2> signals on signal paths 424 from passing to the DIG_TRIM_OUT<5:0> signal paths 156. When turned on, transfer gate 426 shifts the DIG_TRIM<5:0> signals to the right by two bits (discarding the two least significant bits) and replaces the two most significant bits with zeros to provide the DIG_TRIM_OUT<5:0> signals.

In operation, for the selected metal options, in response to a logic high TEMP105 signal or a logic high TEMP125 signal, the DIG_TRIM<5:0> bits are shifted to the right by two bits and the two most significant bits are replaced with zeros. For the non-selected metal options, in response to a logic high TEMP 125 signal, the DIG_TRIM<5:0> bits are shifted to the right by two bits and the two most significant bits are replaced with zeros. In response to a logic high TEMP105 signal, the DIG_TRIM<5:0> bits are shifted to the right by one bit and the most significant bit is replaced with a zero.

Figure 10:
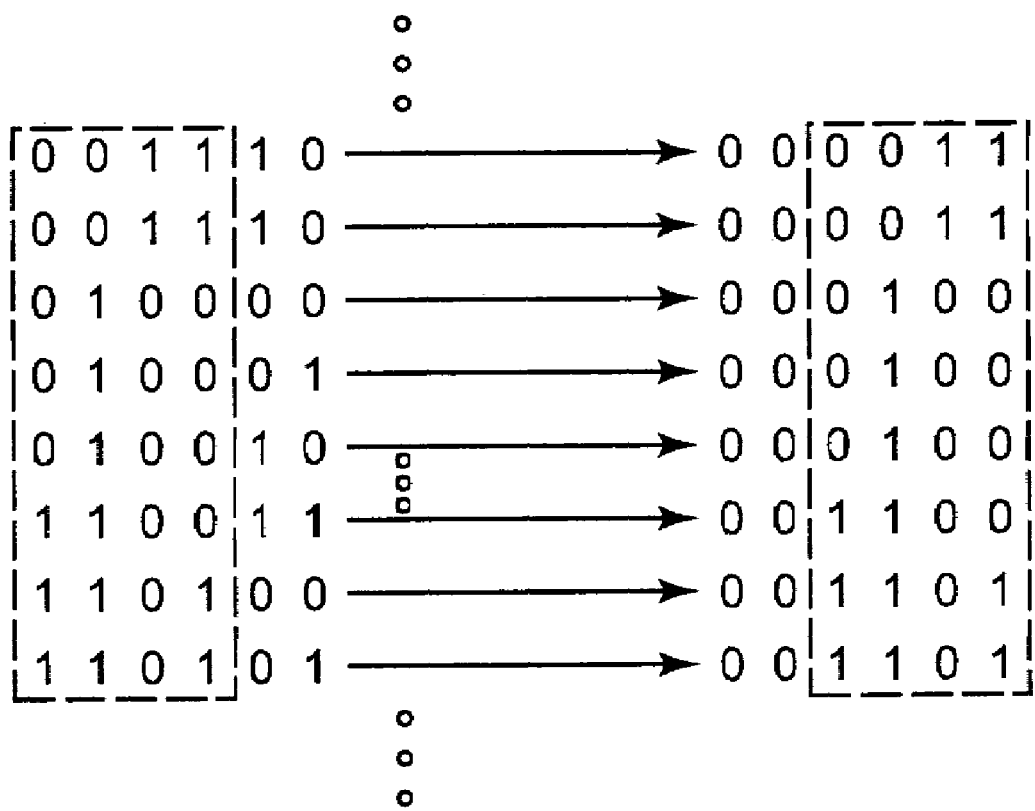
FIG. 10 is a portion of a table illustrating one embodiment of a function of the high temperature booster.

FIG. 10 is a portion of a table illustrating one embodiment of a function of high temperature booster 152 for the selected metal options. High temperature booster 152 boosts the SRF_CLKD2 signal by utilizing the six-bit divider of trimming divider 106. High temperature booster 152 discards a least significant bit and a second least significant bit of the DIG_TRIM<5:0> signals. The remaining four bits are right shifted two positions to the right. A most significant bit and a second most significant bit are then fixed to 00. For example, as shown in the third line of FIG. 10, bit number 010000, equaling numeric value 16 is transformed to 000100, which is numeric value 4. By dividing numeric value 4 by numeric value 16, the frequency of the SRF_CLKD2 signal is increased by a factor of four.

Likewise, as shown in the seventh line of FIG. 10, digital value 110100, which is equal to numeric value 52 is transformed to 001101, which is equal to numeric value 13. By dividing numeric value 13 by numeric value 52, the frequency of the SRF_CLKD2 signal is increased by a factor of four. Therefore, at temperatures greater than 90° C., the refresh frequency is increased by 400 percent. Self-refresh module 150 refreshes the memory cells four times faster at temperatures greater than 90° C. than at temperatures less than 90° C. While increasing the refresh frequency also increases power consumption, the integrity of the memory device is maintained to ensure proper data storage and to prevent corruption or loss of data at all temperatures, including temperatures greater than 90° C.

In one embodiment, the DIV<5:0> signals provided at temperatures greater than 90° C. remain the same as for lower temperatures. Rather, high temperature booster 152 provides the temperature compensation. In this embodiment, temperature divider 112 does not modify the SRF_CLKD2 signal and the SRFPULSE signal is equal to the SRF_CLKD2 signal.

Embodiments of the present invention provide a self-refresh module for providing temperature independent timings and a self-refresh pulse based on the temperature of the memory device. By digitally adjusting the frequency of the self-refresh pulse based on the temperature, power is conserved. In addition, a high temperature booster is used to increase the refresh frequency at high temperatures to prevent data loss or corruption.

What is claimed is:

1. A self-refresh module for a memory device, the self-refresh module comprising:
    an oscillator configured to provide a first signal having a first frequency;
    a trimming divider configured to trim the first signal to provide a second signal having a second frequency;
    a temperature sensor configured to sense a temperature of the memory device and provide a temperature signal;
    a temperature look-up table configured to receive the temperature signal and provide a third signal based on the temperature signal;
    a temperature divider configured to provide a self-refresh pulse signal based on the second signal and the third signal; and
    a high temperature booster configured to receive the temperature signal and increase the second frequency with the temperature sensed greater than a preset temperature.

2. The self-refresh module of claim 1, wherein the third signal comprises a six bit divider value for trimming the second signal in one-sixty-fourth (1/64) increments.

3. The self-refresh module of claim 1, wherein the trimming divider further receives a six bit trimming divider value for trimming the second signal in one-sixty-fourth (1/64) increments.

4. The self-refresh module of claim 1, wherein
    the high temperature booster is configured to increase the second frequency of the second signal by a factor within a range of approximately 2-5 with the temperature sensed greater than 90° C.

5. The self-refresh module of claim 1, wherein the temperature lookup table comprises metal options for setting the third signal based on the temperature signal.

6. A self-refresh module for a memory device, the self-refresh module comprising:
    an oscillator configured to provide a first signal having a first frequency;
    a trimming divider configured to trim the first signal to provide a second signal having a second frequency;
    a temperature sensor configured to sense a temperature of the memory device and provide a temperature signal;

a temperature divider configured to provide a self-refresh pulse signal based on the second signal and the temperature signal; and a high temperature booster configured to receive the temperature signal and boost the second frequency of the second signal by a factor within a range of approximately 2-5 with the sensed temperature greater than 90° C.

7. The self-refresh module of claim 6, wherein the high temperature booster is configured to boost the second frequency of the second signal by discarding a first least significant bit and a second least significant bit of a six bit trimmer divider value, right shifting a remaining four bits, and setting both the first most significant bit and the second most significant bit to zero (0).

8. The self-refresh module of claim 6, wherein the high temperature booster is configured to boost the second frequency of the second signal by discarding a least significant bit of a six bit trimmer divider value, right shifting a remaining five bits, and setting a most significant bit to zero (0).

9. A self-refresh module for a memory device, the self-refresh module comprising:
    an oscillator configured to provide a first signal having a first frequency;
    a divider configured to divide the first signal to provide a divided first signal, the divider further providing temperature independent timings for use by at least one module of the memory device;
    a trimming divider configured to trim the divided first signal to provide a second signal having a second frequency;
    a temperature sensor configured to sense a temperature of the memory device and provide a temperature signal;
    a temperature divider configured to provide a self-refresh pulse signal based on the second signal and the temperature signal; and
    a high temperature booster configured to receive the temperature signal and boost the second frequency of the second signal by a factor within a range of approximately 2-5 with the sensed temperature greater than 90° C.

10. The self-refresh module of claim 6, wherein the temperature divider is configured to complete a cycle of the self-refresh pulse signal before adjusting the self-refresh pulse signal based on a change in the temperature signal.

11. A self-refresh module for a memory device, the self-refresh module comprising:
    an oscillator configured to provide a first signal having a first frequency;
    a divider configured to divide the first signal to provide a second signal having a second frequency and provide temperature independent timings for use by at least one module of the memory device;
    a trimming divider configured to trim the second signal to provide a third signal having a third frequency;
    a temperature sensor configured to sense a temperature of the memory device to provide a temperature signal;
    a temperature look-up table configured to receive the temperature signal and provide a fourth signal based on the temperature signal;
    a temperature divider configured to provide a self-refresh pulse signal based on the third signal and the fourth signal; and
    a high temperature booster configured to receive the temperature signal and increase the third frequency of the third signal by a factor within a range of approximately 2-5 with the sensed temperature greater than 90° C.

12. The self refresh module of claim 11, wherein the memory device comprises a pseudo SRAM.

13. The self refresh module of claim 11, wherein a period of the first signal is within a range of approximately 250-750 nanoseconds.

14. The self-refresh module of claim 11, wherein a period of the second signal is within a range of approximately 500 nanoseconds to 8 microseconds.

15. The self refresh module of claim 11, wherein the temperature sensor is for sensing temperatures of the memory device within a range of approximately −30° C. to 130° C.

16. The self-refresh module of claim 11, wherein the temperature divider is configured to provide both coarse and fine trimming of the self-refresh pulse signal.

17. A method of selecting a self-refresh frequency of a memory device, the method comprising:
    dividing a first signal having a first frequency output from an oscillator, thereby providing a second signal having a second frequency;
    providing temperature independent timings for use by at least one module of the memory device based on the first signal;
    trimming the second signal, thereby providing a third signal having a third frequency;
    sensing a temperature of the memory device;
    providing a temperature signal representative of the temperature sensed;
    trimming the third signal to provide a self-refresh pulse signal based on the temperature signal; and
    boosting the third frequency of the third signal by a factor within a range of approximately 2-5 with the sensed temperature greater than 90° C.

18. The method of claim 17, wherein trimming the second signal further comprises:
    trimming the second signal in one-sixty-fourth (1/64) increments.

19. The method of claim 17, wherein trimming the third signal to provide the self-refresh pulse signal comprises:
    trimming the third signal in one-sixty-fourth (1/64) increments.

20. The method of claim 17, wherein boosting the third frequency of the third signal comprises:
    discarding a first least significant bit and a second least significant bit of a six-bit trimming divider value;
    right shifting each of a remaining four bits two positions to the right; and
    setting both the first most significant bit and the second most significant bit to zero (0).

21. The method of claim 17, wherein boosting the third frequency of the third signal comprises:
    discarding a least significant bit of a six-bit trimming divider value;
    right shifting each of a remaining five bits one positions to the right; and
    setting a most significant bit to zero (0).

22. The method of claim 17, wherein trimming the third signal to provide a self-refresh pulse signal comprises completing a cycle of the self-refresh pulse signal before adjusting the self-refresh pulse signal based on a change in the temperature signal.

23. A method of selecting a self-refresh frequency of a memory device, the method comprising:

trimming a first signal having a first frequency output from an oscillator, thereby producing a second signal having a second frequency;

sensing a temperature of the memory device;

determining an acceptable self-refresh frequency based upon the temperature sensed;

trimming the second signal to provide a self-refresh pulse signal having a frequency equal to the acceptable self-refresh frequency at the temperature sensed; and boosting the second frequency of the second signal with the sensed temperature greater than a preset temperature.

24. The method of claim 23, wherein determining an acceptable self-refresh frequency comprises:

sensing the memory device temperature using a temperature sensor providing a temperature signal;

determining a temperature dependent signal corresponding to the temperature sensed in a look-up table; and determining the acceptable self-refresh frequency based upon the temperature dependent signal.

25. The method of claim 23, wherein boosting the second frequency of the second signal comprises:

boosting the second frequency of the second signal by a factor within a range of approximately 2-5 with the sensed temperature greater than 90° C.

26. The method of claim 23, wherein boosting the second frequency of the second signal comprises:

boosting the second frequency of the second signal by a factor of approximately two with the sensed temperature within a range of approximately 90° C. to 105° C. and by a factor of approximately four with the sensed temperature greater than 105° C.

27. A self-refresh module for a memory device, the self-refresh module comprising:

means for dividing a first signal having a first frequency output from an oscillator, thereby providing a second signal having a second frequency;

means for providing temperature independent timings for use by at least one module of the memory device based on the first signal;

means for trimming the second signal, thereby providing a third signal having a third frequency;

means for sensing a temperature of the memory device;

means for providing a temperature signal representative of the temperature sensed;

means for altering the third frequency of the third signal based on the temperature signal to produce a temperature dependent self-refresh pulse signal; and means for boosting the third frequency of the third signal by a factor within a range of approximately 2-5 with the sensed temperature greater than 90° C.

* * * * *